US010700673B2

(12) United States Patent
Wang et al.

(10) Patent No.: US 10,700,673 B2
(45) Date of Patent: Jun. 30, 2020

(54) COMPARISON CIRCUIT AND DELAY CANCELLATION METHOD

(71) Applicant: Wuxi Chipown Microelectronics Co., Ltd., Jiangsu (CN)

(72) Inventors: Leiyi Wang, Jiangsu (CN); Yutong Zou, Jiangsu (CN); Lixin Zhang, Jiangsu (CN)

(73) Assignee: Wuxi Chipown Microelectronics Co., Ltd., Wuxi (CN)

( * ) Notice: Subject to any disclaimer, the term of this patent is extended or adjusted under 35 U.S.C. 154(b) by 0 days.

(21) Appl. No.: 16/447,389

(22) Filed: Jun. 20, 2019

(65) Prior Publication Data

US 2019/0312574 A1 Oct. 10, 2019

(30) Foreign Application Priority Data

Nov. 16, 2018 (CN) .......................... 2018 1 1373743

(51) Int. Cl.
*H03K 3/22* (2006.01)
*H03K 5/22* (2006.01)
*H03K 5/156* (2006.01)

(52) U.S. Cl.
CPC ............. *H03K 5/22* (2013.01); *H03K 5/1565* (2013.01)

(58) Field of Classification Search
CPC ........ H03K 5/003; H03K 5/08; H03K 5/1565; H03K 5/22; H03K 5/2481; H03K 5/249; H03K 17/60; H03F 3/393; H03F 3/387; H03F 3/45475; H03F 3/45183
See application file for complete search history.

(56) References Cited

U.S. PATENT DOCUMENTS 10,277,175 B2 * 4/2019 Imaizumi ................ H03F 3/005
2006/0164131 A1 * 7/2006 Ruha ..................... G11C 27/026
327/94

* cited by examiner

*Primary Examiner* — Long Nguyen
(74) *Attorney, Agent, or Firm* — Harness, Dickey & Pierce, P.L.C.

(57) ABSTRACT

Comparison circuit and delay cancellation method are provided. The circuit includes a control circuit, capacitors and a transconductance amplifier circuit, wherein the control unit is configured to receive an input signal and control the comparison circuit to be in different working stages; the capacitors are configured to store a DC offset voltage signal at an automatic zero calibration stage; store the input signal when the output signal is inverted at a measurement stage; and store an equivalent delay voltage signal at a delay sampling stage; the transconductance amplifier circuit is configured to store the DC offset voltage signal to the capacitors at the automatic zero calibration stage; compare voltage signals on positive and negative input terminals and generate an output signal at the measurement stage; and store the equivalent delay voltage signal to the capacitors at the delay sampling stage. An inherent delay of the comparison circuit may be cancelled.

16 Claims, 5 Drawing Sheets

COMPARISON CIRCUIT AND DELAY CANCELLATION METHOD

CROSS-REFERENCE TO RELATED APPLICATIONS

This application claims the benefit of priority to Chinese Patent Application No. 201811373743.8, filed on Nov. 16, 2018, the entire disclosure of which is incorporated herein by reference.

TECHNICAL FIELD

The present disclosure generally relates to a circuit field, and more particularly, to a comparison circuit and a delay cancellation method.

BACKGROUND

Comparison circuits are widely used in the circuit field. In a comparison circuit, a real-time, fast and accurate comparison is performed between an input signal and a reference voltage, and a comparison result is output for other circuits to process. For example, once the input signal changes from below the reference voltage to above the reference voltage, or from above the reference voltage to below the reference voltage, the comparison result is immediately output to a subsequent circuit for processing.

In existing techniques, by continuous improvement on structures and device parameters of the comparison circuit, the comparison circuit can output the comparison result quickly and accurately. However, due to an inherent delay (usually tens of nanoseconds), there is always a certain inherent error in the comparison circuit.

Therefore, in the existing comparison circuits, the inherent delay causes an error in the comparison result.

SUMMARY

By embodiments of the present disclosure, an inherent delay in a comparison circuit may be cancelled.

In an embodiment of the present disclosure, a comparison circuit is provided, including a control circuit, capacitors and a transconductance amplifier circuit, where the control unit is configured to: receive an input signal; and control the comparison circuit to be in different working stages based on the input signal and an output signal of the comparison circuit, where the working stages include an automatic zero calibration stage, a measurement stage and a delay sampling stage; the capacitors are configured to: store a Direct Current (DC) offset voltage signal of the transconductance amplifier circuit at the automatic zero calibration stage; store the input signal at a time point when the output signal is inverted at the measurement stage; and store an equivalent delay voltage signal of the transconductance amplifier circuit at the delay sampling stage, where the equivalent delay voltage signal is associated with the input signal stored at the measurement stage; and the transconductance amplifier circuit is configured to: store the DC offset voltage signal of the transconductance amplifier circuit to the capacitors at the automatic zero calibration stage; compare voltage signals on positive and negative input terminals of the comparison circuit and generate an output signal of the comparison circuit at the measurement stage; and compare voltage signals of the positive and negative input terminals of the comparison circuit, and store the equivalent delay voltage signal to the capacitors at the delay sampling stage.

In some embodiments, the transconductance amplifier circuit includes a transconductance amplifier which naturally has a DC offset voltage, where a positive reference terminal of the DC offset voltage is a negative input terminal of the transconductance amplifier circuit, and a negative reference terminal of the DC offset voltage is coupled with a negative input terminal of the transconductance amplifier; and a positive input terminal of the transconductance amplifier is a positive input terminal of the transconductance amplifier circuit, and an output terminal of the transconductance amplifier is an output terminal of the transconductance amplifier circuit.

In some embodiments, the comparison circuit further includes: a voltage buffer circuit, configured to transmit a voltage signal and output the output signal of the comparison circuit; where the control circuit includes a first switch, a second switch, a third switch, a fourth switch, a fifth switch, a sixth switch, a seventh switch, an eighth switch and a ninth switch, the capacitors include a first capacitor, a second capacitor and a third capacitor, and the voltage buffer circuit includes a first voltage buffer, a second voltage buffer and a third voltage buffer, where a first terminal of the first switch is a first input terminal of the comparison circuit and configured to receive the input signal, and a second terminal of the first switch, a positive reference potential terminal of the first capacitor, a first terminal of the second switch and an input terminal of the first voltage buffer are coupled with each other; a negative reference potential terminal of the first capacitor is grounded; a second terminal of the second switch is coupled with an input terminal of the second voltage buffer, and serves as a second input terminal of the comparison circuit to receive a reference signal; an output terminal of the first voltage buffer is coupled with a negative reference potential terminal of the second capacitor and a first terminal of the fifth switch; a positive reference potential terminal of the second capacitor is coupled with a first terminal of the fourth switch and a first terminal of the third switch; a second terminal of the fourth switch is coupled with the positive input terminal of the transconductance amplifier circuit and a second terminal of the fifth switch; an output terminal of the second voltage buffer is coupled with a negative reference potential terminal of the third capacitor; a positive reference potential terminal of the third capacitor is coupled with a first terminal of the sixth switch and the negative input terminal of the transconductance amplifier circuit; a second terminal of the third switch is coupled with the output terminal of the transconductance amplifier circuit, a second terminal of the sixth switch, and a first terminal of the seventh switch; a second terminal of the seventh switch is coupled with a first terminal of the eighth switch, a first terminal of the ninth switch, and an input terminal of the third voltage buffer; a second terminal of the eighth switch and a second terminal of the ninth switch are grounded; and an output terminal of the third voltage buffer is an output terminal of the comparison circuit, and configured to output the output signal of the comparison circuit.

In some embodiments, the control circuit is configured to turn on or turn off the switches to control the comparison circuit to work in different working stages.

In some embodiments, the control circuit is configured to: turn on the second switch, the fifth switch, the sixth switch and the eighth switch, and turn off the first switch, the third switch, the fourth switch, the seventh switch and the ninth switch, to control the comparison circuit to be in the automatic zero calibration stage, so that the third capacitor stores the DC offset voltage signal of the transconductance amplifier circuit; or turn on the first switch, the fourth switch, the seventh switch, and turn off the second switch, the third switch, the fifth switch, the sixth switch, the eighth switch and the ninth switch, to control the comparison circuit to be in the measurement stage, so that the first capacitor stores the input signal at the time point when the output signal is inverted; or turn on the third switch, the fifth switch and the ninth switch, and turn off the first switch, the second switch, the fourth switch, the sixth switch, the seventh switch and the eighth switch, to control the comparison circuit to be in the delay sampling stage, so that the second capacitor stores the equivalent delay voltage signal of the transconductance amplifier circuit.

In some embodiments, the input signal is a periodic signal.

In some embodiments, the periodic signal has a low frequency.

In some embodiments, a period of the periodic signal is longer than an inherent delay of the comparison circuit.

In an embodiment of the present disclosure, a delay cancellation method is provided, where any one of the above comparison circuits is employed for cancelling an inherent delay of the comparison circuit.

Compared with the existing techniques, embodiments of the present disclosure may have following advantages. In embodiments of the present disclosure, based on cooperation of the control circuit, the capacitors and the transconductance amplifier circuit, the comparison circuit is controlled to be in different working stages. An offset of an input signal is generated to make the comparison circuit to output a comparison result earlier during signal comparison. In this way, an inherent delay of the comparison circuit is counteracted equivalently.

DETAILED DESCRIPTION

Figure 1:
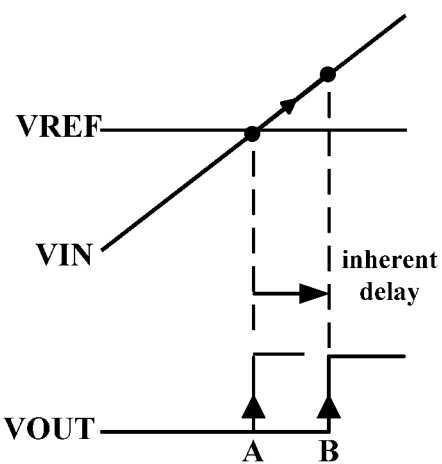
FIG. 1 schematically illustrates a diagram of a comparison error generated in an existing comparison circuit.

In existing techniques, a comparison circuit always has a certain inherent delay which causes an error in a comparison result. For example, as shown in FIG. 1, during the rise of an input signal VIN, when a voltage of the input signal VIN is equal to a reference voltage VREF, VOUT should immediately be inverted to a high level at a time point A. However, due to the inherent delay of the comparison circuit, VOUT is actually inverted to the high level at a time point B when the voltage of the input signal VIN is not equal to the reference voltage VREF. Therefore, an error is caused.

In embodiments of the present disclosure, based on cooperation of a control circuit, capacitors and a transconductance amplifier circuit, a comparison circuit is controlled to be in different working stages. An offset of an input signal is generated to make the comparison circuit to output a comparison result earlier during signal comparison. In this way, an inherent delay of the comparison circuit is counteracted equivalently.

In order to clarify the objects, characteristics and advantages of the disclosure, embodiments of present disclosure will be described in detail in conjunction with accompanying drawings.

Figure 2:
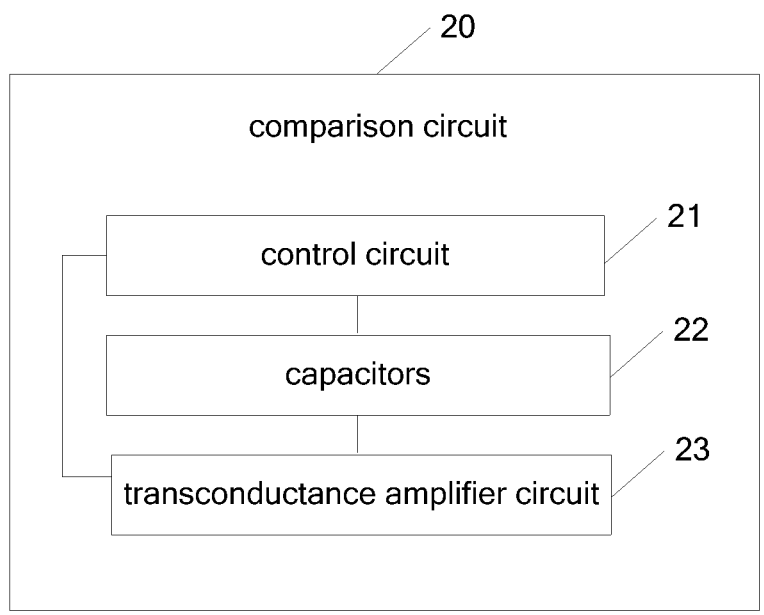
FIG. 2 schematically illustrates a structural diagram of a comparison circuit according to an embodiment of the present disclosure.

Referring to FIG. 2, in an embodiment, a comparison circuit 20 is provided, including a control circuit 21, capacitors 22 and a transconductance amplifier circuit 23.

The control unit 21 is configured to: receive an input signal; and control the comparison circuit to be in different working stages based on the input signal and an output signal of the comparison circuit, where the working stages include an automatic zero calibration stage, a measurement stage and a delay sampling stage.

The capacitors 22 are configured to: store a DC offset voltage signal of the transconductance amplifier circuit 23 at the automatic zero calibration stage; store the input signal at a time point when the output signal is inverted at the measurement stage; and store an equivalent delay voltage signal of the transconductance amplifier circuit 23 at the delay sampling stage, where the equivalent delay voltage signal is associated with the input signal stored at the measurement stage.

The transconductance amplifier circuit 23 is configured to: store the DC offset voltage signal of the transconductance amplifier circuit 23 to the capacitors 22 at the automatic zero calibration stage; compare voltage signals on positive and negative input terminals of the comparison circuit and generate an output signal of the comparison circuit 20 at the measurement stage; and compare voltage signals of the positive and negative input terminals of the comparison circuit, and store the equivalent delay voltage signal to the capacitors 22 at the delay sampling stage.

In some embodiments, the transconductance amplifier circuit 23 stores the DC offset voltage of a transconductance amplifier to the capacitors 22 by using a negative feedback loop formed by the transconductance amplifier circuit 23, at the automatic zero calibration stage, so as to cancel the DC offset voltage when the transconductance amplifier is used at the measurement stage and the delay sampling stage. The transconductance amplifier circuit 23 compares voltage signals on positive and negative input terminals of the comparison circuit 20 and generate an output signal of the comparison circuit 20 by using a buffer circuit at the measurement stage, the voltage signals of the positive and negative input terminals are compared, and the output signal of the comparison circuit 20 is generated in combination with the buffer circuit. The transconductance amplifier circuit 23 compares the voltage signals on the positive and negative input terminals of the comparison circuit 20 and stores the equivalent delay voltage signal (i.e., a voltage signal representing the inherent delay) to the capacitors 22 at the delay sampling stage.

In some embodiments, the transconductance amplifier circuit 23 may include a transconductance amplifier which naturally has a DC offset voltage. For example, the transconductance amplifier circuit 23 may include an ideal transconductance amplifier OTA1 and a DC offset voltage VOS.

In some embodiments, the transconductance amplifier circuit 23 includes a transconductance amplifier which naturally has a DC offset voltage which is inherent and equivalent at a negative input terminal of the transconductance amplifier. A positive reference terminal of the DC offset voltage is a negative input terminal of the transconductance amplifier circuit 23, and a negative reference terminal of the DC offset voltage is coupled with the negative input terminal of the transconductance amplifier. A positive input terminal of the transconductance amplifier is a positive input terminal of the transconductance amplifier circuit 23, and an output terminal of the transconductance amplifier is an output terminal of the transconductance amplifier circuit 23.

In some embodiments, the comparison circuit 20 further includes a voltage buffer circuit (not shown in Figures), configured to transmit a voltage signal or output the output signal of the comparison circuit 20.

In some embodiments, the comparison circuit 20 further includes a voltage buffer circuit (not shown in Figures), configured to transmit a voltage signal and output the output signal of the comparison circuit 20. The control circuit 21 includes a first switch, a second switch, a third switch, a fourth switch, a fifth switch, a sixth switch, a seventh switch, an eighth switch and a ninth switch. The capacitors include a first capacitor, a second capacitor and a third capacitor. The voltage buffer circuit includes a first voltage buffer, a second voltage buffer and a third voltage buffer. A first terminal of the first switch is a first input terminal of the comparison circuit and configured to receive the input signal, and a second terminal of the first switch, a positive reference potential terminal of the first capacitor, a first terminal of the second switch and an input terminal of the first voltage buffer are coupled with each other. A negative reference potential terminal of the first capacitor is grounded. A second terminal of the second switch is coupled with an input terminal of the second voltage buffer, and serves as a second input terminal of the comparison circuit to receive a reference signal. An output terminal of the first voltage buffer is coupled with a negative reference potential terminal of the second capacitor and a first terminal of the fifth switch. A positive reference potential terminal of the second capacitor is coupled with a first terminal of the fourth switch and a first terminal of the third switch. A second terminal of the fourth switch is coupled with the positive input terminal of the transconductance amplifier circuit and a second terminal of the fifth switch. An output terminal of the second voltage buffer is coupled with a negative reference potential terminal of the third capacitor. A positive reference potential terminal of the third capacitor is coupled with a first terminal of the sixth switch and the negative input terminal of the transconductance amplifier circuit. A second terminal of the third switch is coupled with the output terminal of the transconductance amplifier circuit, a second terminal of the sixth switch and a first terminal of the seventh switch. A second terminal of the seventh switch is coupled with a first terminal of the eighth switch, a first terminal of the ninth switch and an input terminal of the third voltage buffer. A second terminal of the eighth switch and a second terminal of the ninth switch are grounded. An output terminal of the third voltage buffer is an output terminal of the comparison circuit, and configured to output the output signal of the comparison circuit.

In some embodiments, the input signal is a periodic signal.

In some embodiments, the periodic signal has a low frequency.

In some embodiments, a period of the periodic signal is longer than an inherent delay of the comparison circuit.

Figure 3:
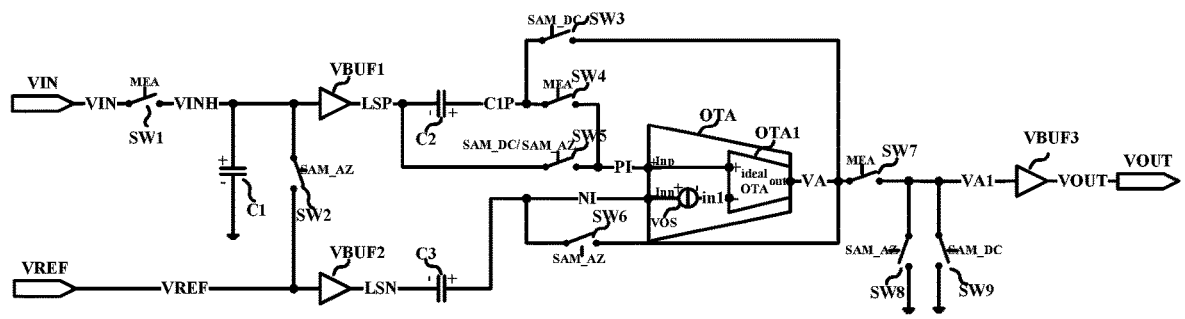
FIG. 3 schematically illustrates a structural diagram of a comparison circuit according to another embodiment of the present disclosure.

To make those skilled in the art better understand and implement embodiments of the present disclosure, FIG. 3 schematically illustrates a structural diagram of a comparison circuit according to another embodiment of the present disclosure.

Referring to FIG. 3, the comparison circuit includes a control circuit, capacitors, a transconductance amplifier circuit and a voltage buffer circuit. The control circuit includes a first switch SW1, a second switch SW2, a third switch SW3, a fourth switch SW4, a fifth switch SW5, a sixth switch SW6, a seventh switch SW7, an eighth switch SW8 and a ninth switch SW9. The capacitors include a first capacitor C1, a second capacitor C2 and a third capacitor C3. The voltage buffer circuit includes a first voltage buffer VBUF1, a second voltage buffer VBUF2 and a third voltage buffer VBUF3. The transconductance amplifier circuit OTA includes a DC offset voltage VOS and an ideal transconductance amplifier OTA1.

A first terminal of the first switch SW1 is a first input terminal VIN of the comparison circuit, and a second terminal of the first switch SW1 is coupled with a positive reference potential terminal of the first capacitor C1, a first terminal of the second switch SW2 and an input terminal of the first voltage buffer VBUF1.

A negative reference potential terminal of the first capacitor C1 is grounded.

A second terminal of the second switch SW2 is coupled with an input terminal of the second voltage buffer VBUF2, and serves as a second input terminal VREF of the comparison circuit.

An output terminal of the first voltage buffer VBUF1 is coupled with a negative reference potential terminal of the second capacitor C2 and a first terminal of the fifth switch SW5.

A positive reference potential terminal of the second capacitor C2 is coupled with a first terminal of the fourth switch SW4 and a first terminal of the third switch SW3.

A second terminal of the fourth switch SW4 is coupled with the positive input terminal of the transconductance amplifier circuit OTA and a second terminal of the fifth switch SW5.

An output terminal of the second voltage buffer VBUF2 is coupled with a negative reference potential terminal of the third capacitor C3.

A positive reference potential terminal of the third capacitor C3 is coupled with a first terminal of the sixth switch SW6 and the negative input terminal of the transconductance amplifier circuit OTA.

A second terminal of the third switch SW3 is coupled with the output terminal of the transconductance amplifier circuit OTA, a second terminal of the sixth switch SW6 and a first terminal of the seventh switch SW7.

A second terminal of the seventh switch SW7 is coupled with a first terminal of the eighth switch SW8, a first terminal of the ninth switch SW9 and an input terminal of the third voltage buffer VBUF3.

A second terminal of the eighth switch SW8 and a second terminal of the ninth switch SW9 are grounded.

An output terminal of the third voltage buffer VBUF3 is an output terminal of the comparison circuit, and configured to output the output signal of the comparison circuit.

A positive reference terminal of the DC offset voltage VOS is a negative input terminal of the transconductance amplifier circuit OTA, and a negative reference terminal of the DC offset voltage VOS is coupled with a negative input terminal of the transconductance amplifier OTA1.

A positive input terminal of the transconductance amplifier OTA1 is a positive input terminal of the transconductance amplifier circuit OTA, and an output terminal of the transconductance amplifier OTA is coupled with an output terminal of the transconductance amplifier circuit OTA.

In some embodiments, the control circuit is configured to turn on or turn off some of the switches to control the comparison circuit to work in different working stages.

Referring to FIG. 3, the first switch SW1, the second switch SW2, the third switch SW3, the fourth switch SW4, the fifth switch SW5, the sixth switch SW6, the seventh switch SW7, the eighth switch SW8 and the ninth switch SW9 are controlled by control signals MEA, SAM_AZ, SAM_DC, MEA, SAM_AZ/SAM_DC, SAM_AZ, MEA, SAM_AZ and SAM_DC, respectively. When the control signal is at a high level, the corresponding switch controlled by the control signal is turned on; or else, the corresponding switch is turned off.

In some embodiments, the fifth switch SW5 is controlled by the control signals SAM_AZ and SAM_DC commonly. When either of the control signals SAM_AZ and SAM_DC is at a high level, the fifth switch SW5 is turned on; or when both of the control signals SAM_AZ and SAM_DC are at low levels, the fifth switch SW5 is turned off.

In some embodiments, the control circuit is configured to: turn on the second switch, the fifth switch, the sixth switch and the eighth switch, and turn off the first switch, the third switch, the fourth switch, the seventh switch and the ninth switch, to control the comparison circuit to be in the automatic zero calibration stage, so that the third capacitor stores the DC offset voltage signal of the transconductance amplifier circuit; or turn on the first switch, the fourth switch, the seventh switch, and turn off the second switch, the third switch, the fifth switch, the sixth switch, the eighth switch and the ninth switch, to control the comparison circuit to be in the measurement stage, so that the first capacitor stores the input signal at the time point when the output signal is inverted; or turn on the third switch, the fifth switch and the ninth switch, and turn off the first switch, the second switch, the fourth switch, the sixth switch, the seventh switch and the eighth switch, to control the comparison circuit to be in the delay sampling stage, so that the second capacitor stores the equivalent delay voltage signal of the transconductance amplifier circuit.

Figure 4:
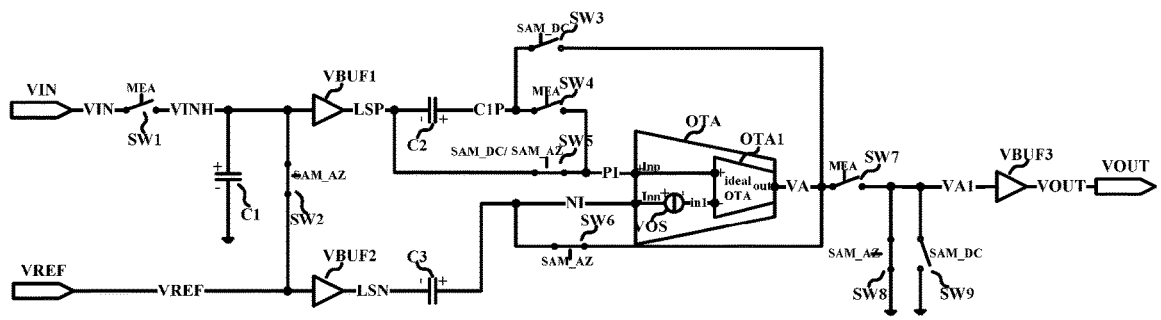
FIG. 4 schematically illustrates a structural diagram of a comparison circuit at an automatic zero calibration stage according to an embodiment of the present disclosure.

To make those skilled in the art better understand and implement embodiments of the present disclosure, FIG. 4 schematically illustrates a structural diagram of a comparison circuit at an automatic zero calibration stage according to an embodiment of the present disclosure.

Referring to FIG. 4, at the automatic zero calibration stage, the control signal SAM_AZ is at a high level, other control signals are at low levels, the second switch SW2, the fifth switch SW5, the sixth switch SW6 and the eighth switch SW8 are turned on, and other switches are turned off.

In some embodiments, the transconductance amplifier circuit OTA includes a DC offset voltage VOS.

In the automatic zero calibration stage, potentials of input terminals of the first voltage buffer VBUF1 and the second voltage buffer VBUF2 are equal to the reference voltage VREF, and a negative input terminal and an output terminal of the transconductance amplifier circuit OTA are shorted to constitute a negative feedback loop. According to the "virtual short" principle, by enabling a potential of the positive input terminal of the transconductance amplifier circuit OTA to be equal to a potential of the negative input terminal of the ideal transconductance amplifier OTA1, that is, the potential of the negative input terminal of the ideal transconductance amplifier OTA1 being also equal to the reference voltage VREF, a voltage equal to the DC offset voltage VOS is stored on the third capacitor C3.

For example, when the DC offset voltage VOS is 10 mV, a voltage of 10 mV is also stored on the third capacitor C3, thus, the DC offset voltage VOS is completely cancelled, and the reference voltage VREF can be input to the negative input terminal of the ideal transconductance amplifier OTA1 without being changed. Thereafter, when the comparison circuit is in the measurement stage or the delay sampling stage, the voltage stored on the third capacitor C3 and the DC offset voltage VOS counteract, thereby eliminating the DC offset error of the transconductance amplifier circuit OTA.

In some embodiments, after being initiated for a particular time period, the automatic zero calibration stage ends itself.

Figure 5:
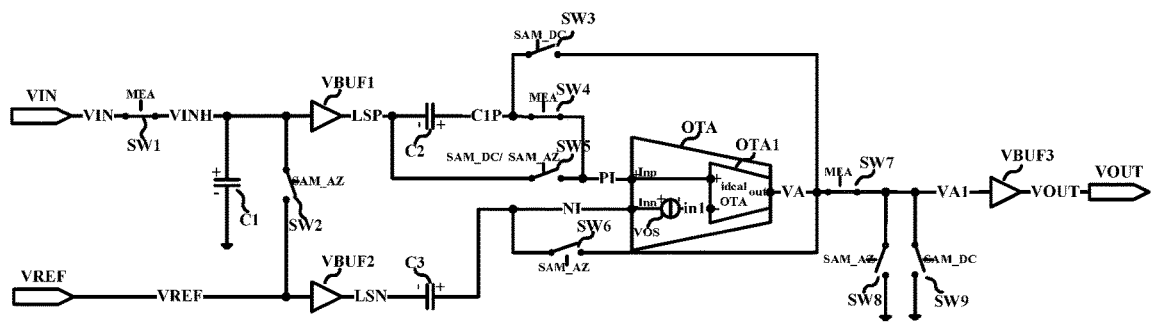
FIG. 5 schematically illustrates a structural diagram of a comparison circuit at a measurement stage according to an embodiment of the present disclosure.

To make those skilled in the art better understand and implement embodiments of the present disclosure, FIG. 5 schematically illustrates a structural diagram of a comparison circuit at a measurement stage according to an embodiment of the present disclosure.

Referring to FIG. 5, at the measurement stage, the control signal MEAS is at a high level, other control signals are at low levels, the first switch SW1, the fourth switch SW4 and the seventh switch SW7 are turned on, and other switches are turned off.

During the measurement stage, after a fixed period of time (e.g., no-overlap time) in a new cycle of the input signal VIN, a comparison of the input signal VIN with the reference voltage is performed. Once the output signal VOUT is inverted, the first switch SW1 will be immediately turned off, thereby the instantaneous input signal VIN at this time is stored on the first capacitor C1. A voltage difference (also called an input margin) between the voltage on the first capacitor C1 and the reference voltage VREF is proportional to the equivalent delay of the comparison circuit. The greater the voltage difference, the longer the equivalent delay of the comparison circuit. A period from a time point when the comparison begins to a time point when the output signal VOUT is inverted is the measurement stage.

In some embodiments, the no-overlap time is set to avoid an unstable stage of the input signal.

In some embodiments, the input signal VIN may be a periodic signal with a low frequency, such as a periodic signal having a period greater than 10*T, where T is an inherent delay of the comparison circuit.

Figure 6:
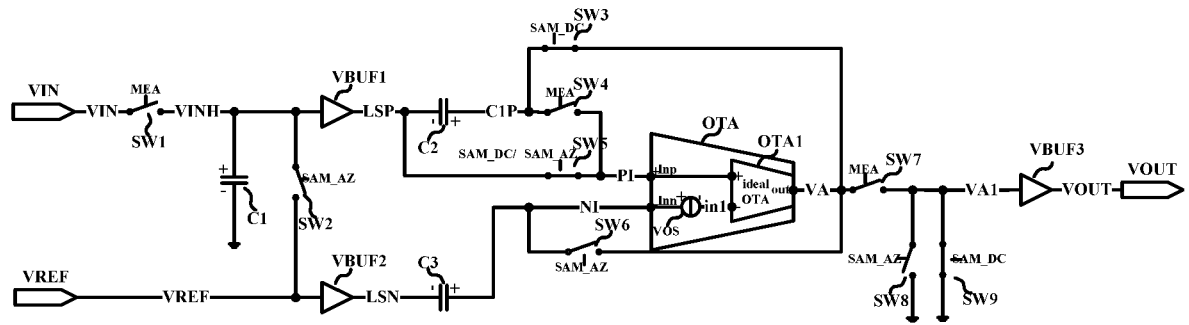
FIG. 6 schematically illustrates a structural diagram of a comparison circuit at a delay sampling stage according to an embodiment of the present disclosure.

To make those skilled in the art better understand and implement embodiments of the present disclosure, FIG. 6 schematically illustrates a structural diagram of a comparison circuit at a delay sampling stage according to an embodiment of the present disclosure.

Referring to FIG. 6, in the delay sampling stage, the control signal SAM_DC is at a high level, other control signals are at low levels, the third switch SW3, the fifth switch SW5 and the ninth switch SW9 are turned on, and other switches are turned off.

In the delay sampling stage, the output of the transconductance amplifier circuit OTA is connected to the positive reference potential terminal of the second capacitor C2. Whether the second capacitor C2 is charged or discharged is determined by the polarity of a voltage difference between the voltage on the first capacitor C1 and the reference voltage VREF. After a certain period, the delay sampling stage ends itself. The equivalent delay information of the comparison circuit is stored on the second capacitor C2, and its value is recorded as VC1. Thus, in the next measurement stage, the DC offset voltage (which is equal to the voltage on the second capacitor C2) is artificially applied to the positive input terminal of the transconductance amplifier circuit OTA to invert the output terminal VOUT earlier, thereby cancelling the inherent delay of the comparison circuit. After a number of cycles, the voltage on the second capacitor C2 will tend to stabilize, and the equivalent delay of the comparison circuit is minimized.

For example, after the voltage on the second capacitor C2 is stabilized, the input signal VIN is superimposed with the voltage of the second capacitor C2, and then input to the positive input terminal of the transconductance amplifier circuit OTA, which is equivalent to the input signal VIN being artificially superimposed with a DC offset voltage. In this way, during the measurement stage, the output signal VOUT may be inverted earlier when the input signal VIN rises.

Figure 7:
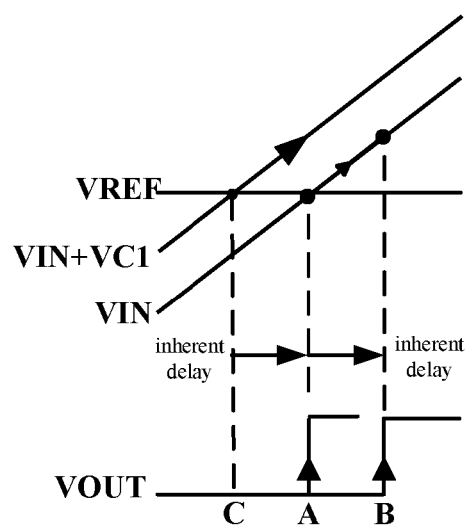
FIG. 7 schematically illustrates a diagram of sequential relations of a comparison circuit according to an embodiment of the present disclosure.

As shown in FIG. 7, in the existing techniques, the output signal VOUT is inverted at a time point A, but is inverted at a time point B after the inherent delay of the comparison circuit, which results in an error in a comparison result.

By applying the comparison circuit provided in the embodiments of the present disclosure, as the VC1 is superimposed, the output signal VOUT of the comparison circuit is inverted at a time point C, but is further inverted at the time point A after the inherent delay of the comparison circuit, so that the equivalent delay of the comparison circuit is equal to zero.

It could be understood that, units not closely related to solving the technical problem proposed by the present disclosure are not introduced to highlight innovative parts of the present disclosure, which does not indicate that there are no other units in the embodiments of the present disclosure.

By embodiments of the present disclosure, based on cooperation of the control circuit, the capacitors and the transconductance amplifier circuit, the comparison circuit is controlled to be in different working stages. An offset of an input signal is generated to make the comparison circuit to output a comparison result earlier during signal comparison. In this way, an inherent delay of the comparison circuit is counteracted equivalently.

Further, embodiments of the present disclosure provide fast, accurate and error-free comparison.

Figure 8:
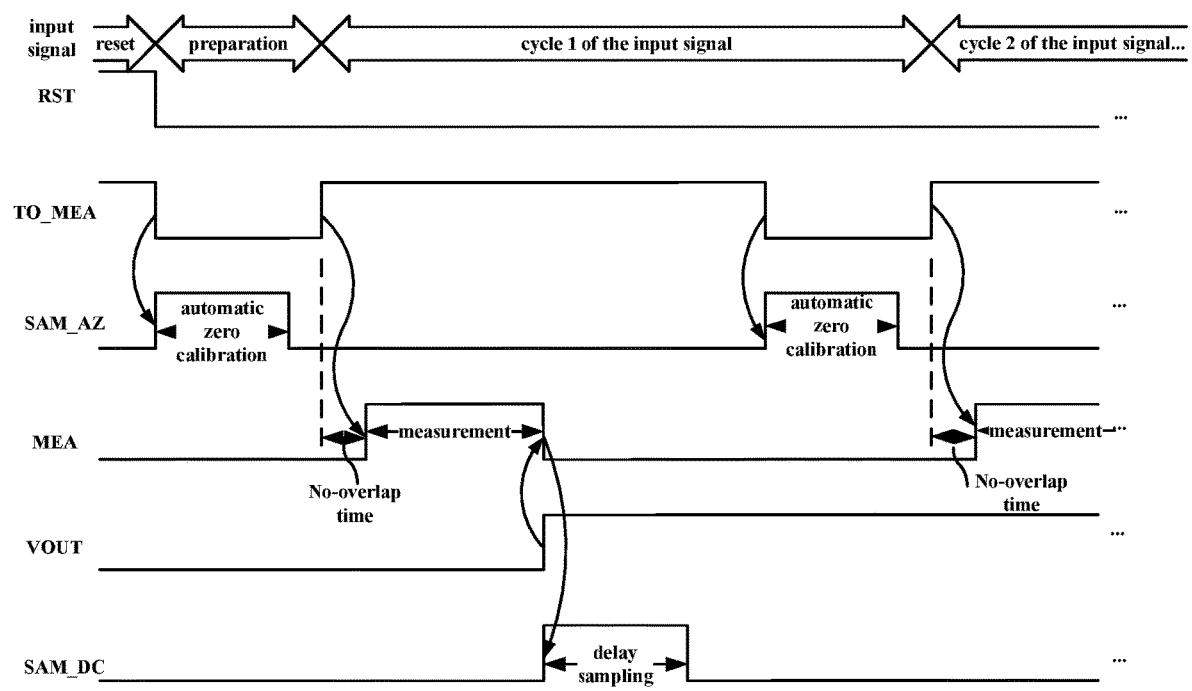
FIG. 8 schematically illustrates a diagram of sequential relations of a comparison circuit according to an embodiment of the present disclosure.

In order to enable a person skilled in the art to better understand and implement the present invention, FIG. 8 schematically illustrates a diagram of sequential logic of a comparison circuit according to an embodiment of the present disclosure.

Referring to FIG. 8, RST is a reset signal, and TO_MEA is a signal associated with the input signal. The input signal appears during a previous period of one cycle and then no longer appears until the next cycle. When there is no input signal input, the TO_MEA signal is also low level. SAM_AZ, MEA and SAM_DC are control signals of the control circuit to control the switches to be turned on or turned off, and VOUT is the output signal.

In order to increase readability of the sequential logic diagram, the sequential logic diagram is divided into four time periods according to the input signal, including "reset", "preparation", "cycle 1 of the input signal" and "cycle 2 of the input signal".

During the "reset" time period, RST is at a high level, and the comparison circuit is initialized. When RST goes low, the "preparation" time period is entered, and a falling edge of TO_MEA triggers a rising edge of SAM_AZ. At this time, an automatic zero calibration stage is entered. After a fixed time period, the automatic zero calibration stage ends. Afterward, the comparison system waits until entering the period "cycle 1 of the input signal". At this time, a rising edge of TO_MEA is triggered. After a short fixed no-overlap period, the comparison circuit enters a "test" stage to compare the input signal VIN with the reference voltage VREF. Once the comparison is performed, the output signal VOUT is inverted. A falling edge of MEA is triggered, and the falling edge of the MEA triggers a rising edge of the SAM_DC. The comparison circuit enters the delay sampling stage. After a fixed time period, the delay sampling stage ends itself. After a falling edge of TO_MEA is triggered and further triggers a rising edge of SAM_ZA, the automatic zero calibration stage is entered. The automatic zero calibration stage ends after a fixed time period. When the period "cycle 1 of the input signal" of the input signal VIN ends, the period "cycle 2 of the input signal" is entered. Afterward, the processes during the period "cycle 1 of the input signal" are repeated.

In an embodiment of the present disclosure, a delay cancellation method is provided, where any one of the above comparison circuits is employed for cancelling an inherent delay of the comparison circuit.

Figure 9:
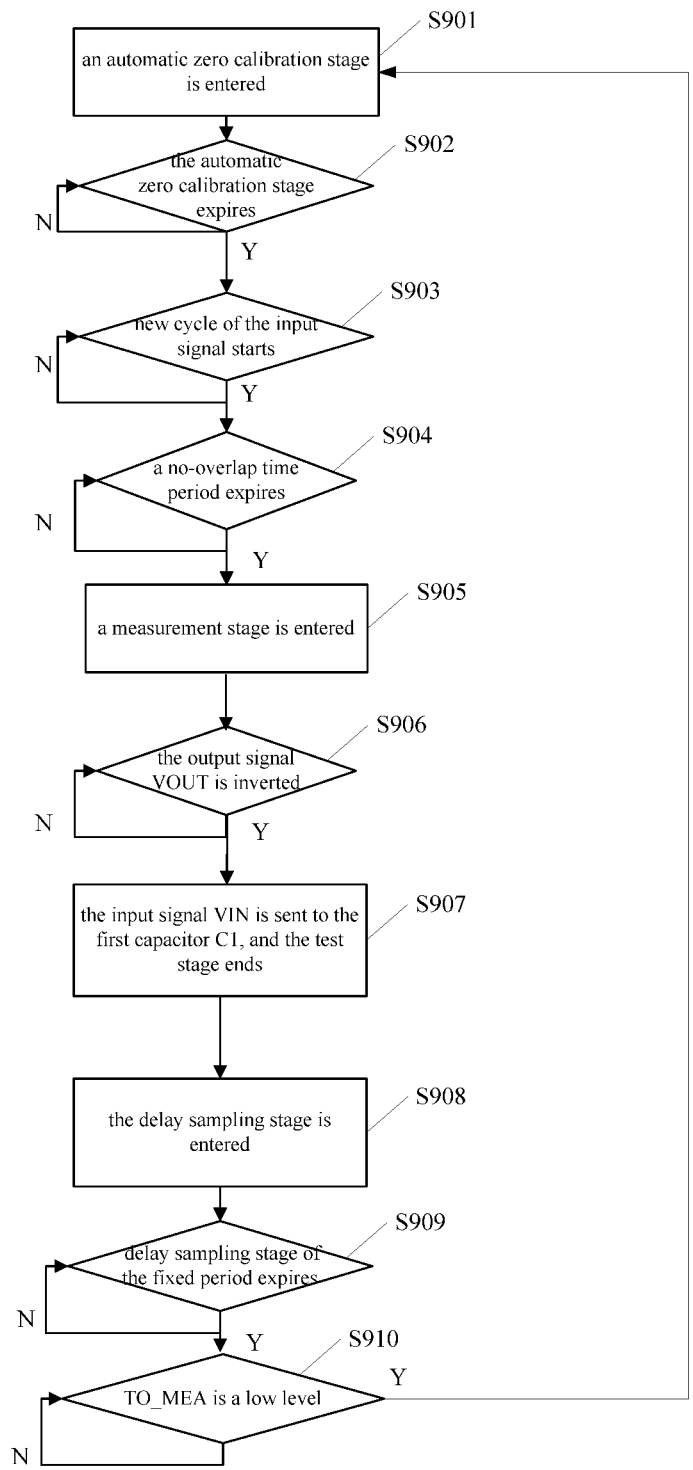
FIG. 9 schematically illustrates a flow chart of a delay cancellation method according to an embodiment of the present disclosure.

In order to enable a person skilled in the art to better understand and implement the present invention, FIG. 9 schematically illustrates a flow chart of a delay cancellation method according to an embodiment of the present disclosure.

Referring to FIG. 9, the delay cancellation method may include S901 to S910.

In S901, an automatic zero calibration stage is entered.

In some embodiments, after starting working, the comparison circuit enters an automatic zero calibration stage to cancel an input offset of the transconductance amplifier circuit OTA, so that the reference voltage VREF is completely compared. This stage ends after a fixed time period;

In S902, it is determined whether the automatic zero calibration stage of the fixed time period expires. If it expires, S903 is performed; otherwise, S902 is performed.

In S903, it is determined whether a new cycle of the input signal is started (i.e., whether TO_MEA is at a rising edge). If the new cycle of the input signal starts, S904 is performed; otherwise, S903 is performed.

In S904, it is determined whether a no-overlap time period expires. If the no-overlap time expires, step S905 is performed; otherwise, S904 is performed.

In S905, a measurement stage is entered.

In S906, it is determined whether the output signal VOUT is inverted. If the output signal VOUT is inverted, S907 is performed; otherwise, S906 is performed.

In S907, the input signal VIN is sent to the first capacitor C1, and the test stage ends.

In some embodiments, after the automatic zero calibration stage ends, the new cycle of the input signal VIN starts and a rising edge of TO_MEA is triggered. Afterward, the fixed no-overlap time period starts, and the measurement stage is entered after the no-overlap time period expires. During the measurement stage, the input voltage is compared with the reference voltage. Once the output signal VOUT is inverted, a voltage of the input signal VIN at this time is immediately stored on the first capacitor C1, and a voltage difference between the voltage and the reference voltage (also called an input margin) is proportional to an equivalent delay of the comparison circuit. The greater the voltage difference, the longer the equivalent delay of the comparison circuit.

In S908, the delay sampling stage is entered.

In some embodiments, in the delay sampling stage, according to the voltage stored on the first capacitor C1, information of the equivalent delay is converted into a voltage which is stored on the second capacitor C2.

In some embodiments, the delay sampling stage is entered after the measurement stage ends. At this stage, according to the voltage on the first capacitor C1, the information of the equivalent delay is converted into a voltage to be stored on the second capacitor C2 via the transconductance amplifier circuit OTA. The voltage, as an offset of the input signal VIN in a next measurement stage, is involved in comparison of the input signal VIN with the reference voltage VREF. After a fixed time period, the delay sampling stage ends itself.

In S909, it is determined whether the delay sampling stage of the fixed time period expires. If it expires, S910 is performed; otherwise, S909 is performed.

In S910, it is determined whether TO_MEA is a low level. If TO_MEA is a low level, S901 is performed; otherwise, S910 is performed.

In some embodiments, after the delay sampling stage ends and a falling edge of TO_MEA is triggered, the automatic zero calibration stage is entered for a second time, and then the above steps are repeated until the voltage on the second capacitor C2 tends to be stable after a plurality of cycles. At this point, the "input margin" is minimized, and the equivalent delay of the comparison circuit is minimized.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure. Therefore, the protection scope of the present disclosure is subject to the scope defined by the claims.

What is claimed is:

1. A comparison circuit, comprising a control circuit, capacitors and a transconductance amplifier circuit,
wherein the control circuit is configured to: receive an input signal; and control the comparison circuit to be in different working stages based on the input signal and an output signal of the comparison circuit, wherein the working stages comprise an automatic zero calibration stage, a measurement stage and a delay sampling stage;
the capacitors are configured to: store a Direct Current (DC) offset voltage signal of the transconductance amplifier circuit at the automatic zero calibration stage; store the input signal at a time point when the output signal is inverted at the measurement stage; and store an equivalent delay voltage signal of the transconductance amplifier circuit at the delay sampling stage, wherein the equivalent delay voltage signal is associated with the input signal stored at the measurement stage; and
the transconductance amplifier circuit is configured to: store the DC offset voltage signal of the transconductance amplifier circuit to the capacitors at the automatic zero calibration stage; compare voltage signals on positive and negative input terminals of the transconductance amplifier circuit and generate the output signal of the comparison circuit at the measurement stage; and compare the voltage signals of the positive and negative input terminals of the transconductance amplifier circuit, and store the equivalent delay voltage signal to the capacitors at the delay sampling stage.

2. The comparison circuit according to claim 1, wherein the transconductance amplifier circuit comprises a transconductance amplifier which naturally has a DC offset voltage,
wherein a positive reference terminal of the DC offset voltage is the negative input terminal of the transconductance amplifier circuit, and a negative reference terminal of the DC offset voltage is coupled with a negative input terminal of the transconductance amplifier; and
a positive input terminal of the transconductance amplifier is the positive input terminal of the transconductance amplifier circuit, and an output terminal of the transconductance amplifier is an output terminal of the transconductance amplifier circuit.

3. The comparison circuit according to claim 2, further comprising:
a voltage buffer circuit, configured to transmit a voltage signal and output the output signal of the comparison circuit;
wherein the control circuit includes a first switch, a second switch, a third switch, a fourth switch, a fifth switch, a sixth switch, a seventh switch, an eighth switch and a ninth switch, the capacitors comprise a first capacitor, a second capacitor and a third capacitor, and the voltage buffer circuit comprises a first voltage buffer, a second voltage buffer and a third voltage buffer,
wherein a first terminal of the first switch is a first input terminal of the comparison circuit and configured to receive the input signal, and a second terminal of the first switch, a positive reference potential terminal of the first capacitor, a first terminal of the second switch and an input terminal of the first voltage buffer are coupled with each other;
a negative reference potential terminal of the first capacitor is grounded;
a second terminal of the second switch is coupled with an input terminal of the second voltage buffer, and serves as a second input terminal of the comparison circuit to receive a reference signal;
an output terminal of the first voltage buffer is coupled with a negative reference potential terminal of the second capacitor and a first terminal of the fifth switch;
a positive reference potential terminal of the second capacitor is coupled with a first terminal of the fourth switch and a first terminal of the third switch;
a second terminal of the fourth switch is coupled with the positive input terminal of the transconductance amplifier circuit and a second terminal of the fifth switch;
an output terminal of the second voltage buffer is coupled with a negative reference potential terminal of the third capacitor;
a positive reference potential terminal of the third capacitor is coupled with a first terminal of the sixth switch and the negative input terminal of the transconductance amplifier circuit;
a second terminal of the third switch is coupled with the output terminal of the transconductance amplifier circuit, a second terminal of the sixth switch, and a first terminal of the seventh switch;
a second terminal of the seventh switch is coupled with a first terminal of the eighth switch, a first terminal of the ninth switch, and an input terminal of the third voltage buffer;
a second terminal of the eighth switch and a second terminal of the ninth switch are grounded; and an output terminal of the third voltage buffer is an output terminal of the comparison circuit, and configured to output the output signal of the comparison circuit.

4. The comparison circuit according to claim 3, wherein the control circuit is configured to turn on or turn off the switches to control the comparison circuit to work in the different working stages.

5. The comparison circuit according to claim 4, wherein the control circuit is configured to:
turn on the second switch, the fifth switch, the sixth switch and the eighth switch, and turn off the first switch, the third switch, the fourth switch, the seventh switch and the ninth switch, to control the comparison circuit to be in the automatic zero calibration stage, so that the third capacitor stores the DC offset voltage signal of the transconductance amplifier circuit; or
turn on the first switch, the fourth switch, the seventh switch, and turn off the second switch, the third switch, the fifth switch, the sixth switch, the eighth switch and the ninth switch, to control the comparison circuit to be in the measurement stage, so that the first capacitor stores the input signal at the time point when the output signal is inverted; or
turn on the third switch, the fifth switch and the ninth switch, and turn off the first switch, the second switch, the fourth switch, the sixth switch, the seventh switch and the eighth switch, to control the comparison circuit to be in the delay sampling stage, so that the second capacitor stores the equivalent delay voltage signal of the transconductance amplifier circuit.

6. The comparison circuit according to claim 5, wherein the input signal is a periodic signal.

7. The comparison circuit according to claim 6, wherein the periodic signal has a low frequency.

8. The comparison circuit according to claim 6, wherein a period of the periodic signal is longer than an inherent delay of the comparison circuit.

9. A delay cancellation method, wherein a comparison circuit is employed for cancelling an inherent delay of the comparison circuit, wherein the comparison circuit comprises a control circuit, capacitors and a transconductance amplifier circuit,
wherein the control circuit is configured to: receive an input signal; and control the comparison circuit to be in different working stages based on the input signal and an output signal of the comparison circuit, wherein the working stages comprise an automatic zero calibration stage, a measurement stage and a delay sampling stage;
the capacitors are configured to: store a Direct Current (DC) offset voltage signal of the transconductance amplifier circuit at the automatic zero calibration stage; store the input signal at a time point when the output signal is inverted at the measurement stage; and store an equivalent delay voltage signal of the transconductance amplifier circuit at the delay sampling stage, wherein the equivalent delay voltage signal is associated with the input signal stored at the measurement stage; and
the transconductance amplifier circuit is configured to: store the DC offset voltage signal of the transconductance amplifier circuit to the capacitors at the automatic zero calibration stage; compare voltage signals on positive and negative input terminals of the transconductance amplifier circuit and generate the output signal of the comparison circuit at the measurement stage; and compare the voltage signals of the positive and negative input terminals of the transconductance amplifier circuit, and store the equivalent delay voltage signal to the capacitors at the delay sampling stage.

10. The method according to claim 9, wherein the transconductance amplifier circuit comprises a transconductance amplifier which naturally has a DC offset voltage,
wherein a positive reference terminal of the DC offset voltage is the negative input terminal of the transconductance amplifier circuit, and a negative reference terminal of the DC offset voltage is coupled with a negative input terminal of the transconductance amplifier; and
a positive input terminal of the transconductance amplifier is the positive input terminal of the transconductance amplifier circuit, and an output terminal of the transconductance amplifier is coupled with an output terminal of the transconductance amplifier circuit.

11. The method according to claim 10, further comprising:
a voltage buffer circuit, configured to transmit a voltage signal and output the output signal of the comparison circuit;
wherein the control circuit includes a first switch, a second switch, a third switch, a fourth switch, a fifth switch, a sixth switch, a seventh switch, an eighth switch and a ninth switch, the capacitors comprise a first capacitor, a second capacitor and a third capacitor, and the voltage buffer circuit comprises a first voltage buffer, a second voltage buffer and a third voltage buffer,
wherein a first terminal of the first switch is a first input terminal of the comparison circuit and configured to receive the input signal, and a second terminal of the first switch, a positive reference potential terminal of the first capacitor, a first terminal of the second switch and an input terminal of the first voltage buffer are coupled with each other;
a negative reference potential terminal of the first capacitor is grounded;
a second terminal of the second switch is coupled with an input terminal of the second voltage buffer, and serves as a second input terminal of the comparison circuit to receive a reference signal;
an output terminal of the first voltage buffer is coupled with a negative reference potential terminal of the second capacitor and a first terminal of the fifth switch;
a positive reference potential terminal of the second capacitor is coupled with a first terminal of the fourth switch and a first terminal of the third switch;
a second terminal of the fourth switch is coupled with the positive input terminal of the transconductance amplifier circuit and a second terminal of the fifth switch;
an output terminal of the second voltage buffer is coupled with a negative reference potential terminal of the third capacitor;
a positive reference potential terminal of the third capacitor is coupled with a first terminal of the sixth switch and the negative input terminal of the transconductance amplifier circuit;
a second terminal of the third switch is coupled with the output terminal of the transconductance amplifier circuit, a second terminal of the sixth switch, and a first terminal of the seventh switch;
a second terminal of the seventh switch is coupled with a first terminal of the eighth switch, a first terminal of the ninth switch, and an input terminal of the third voltage buffer;

a second terminal of the eighth switch and a second terminal of the ninth switch are grounded; and an output terminal of the third voltage buffer is an output terminal of the comparison circuit, and configured to output the output signal of the comparison circuit.

12. The method according to claim 11, wherein the control circuit is configured to turn on or turn off the switches to control the comparison circuit to work in the different working stages.

13. The method according to claim 12, wherein the control circuit is configured to:

turn on the second switch, the fifth switch, the sixth switch and the eighth switch, and turn off the first switch, the third switch, the fourth switch, the seventh switch and the ninth switch, to control the comparison circuit to be in the automatic zero calibration stage, so that the third capacitor stores the DC offset voltage signal of the transconductance amplifier circuit; or turn on the first switch, the fourth switch, the seventh switch, and turn off the second switch, the third switch, the fifth switch, the sixth switch, the eighth switch and the ninth switch, to control the comparison circuit to be in the measurement stage, so that the first capacitor stores the input signal at the time point when the output signal is inverted; or turn on the third switch, the fifth switch and the ninth switch, and turn off the first switch, the second switch, the fourth switch, the sixth switch, the seventh switch and the eighth switch, to control the comparison circuit to be in the delay sampling stage, so that the second capacitor stores the equivalent delay voltage signal of the transconductance amplifier circuit.

14. The method according to claim 13, wherein the input signal is a periodic signal.

15. The method according to claim 14, wherein the periodic signal has a low frequency.

16. The method according to claim 14, wherein a period of the periodic signal is longer than an inherent delay of the comparison circuit.

\* \* \* \* \*